United States Patent [19]
Morgan

[11] Patent Number: 5,305,263
[45] Date of Patent: Apr. 19, 1994

[54] SIMPLIFIED LOW POWER FLASH WRITE OPERATION

[75] Inventor: Donald M. Morgan, Boise, Id.

[73] Assignee: Micron Technology, Inc., Boise, Id.

[21] Appl. No.: 713,902

[22] Filed: Jun. 12, 1991

[51] Int. Cl.$^5$ .................... G11C 7/00; G11C 8/00; G11C 11/24

[52] U.S. Cl. .................... 365/190; 365/218; 365/900

[58] Field of Search .......... 365/218, 900, 190

[56] References Cited

U.S. PATENT DOCUMENTS

| | | | |
|---|---|---|---|
| 5,140,553 | 8/1992 | Choi et al. | 365/218 |
| 5,155,705 | 10/1992 | Goto et al. | 365/218 |

FOREIGN PATENT DOCUMENTS

| | | | |
|---|---|---|---|
| 0176587 | 10/1982 | Japan | 365/218 |
| 0182097 | 9/1985 | Japan | 365/218 |
| 0306590 | 12/1988 | Japan | 365/218 |

Primary Examiner—John Zazworsky
Attorney, Agent, or Firm—Susan B. Collier

[57] ABSTRACT

In the preferred embodiment of the present invention flash write, a simultaneous and substantially identical write operation to a selected plurality of memory cells, is performed by splitting the pull up of the p sense amplifier transistors. The p sense amplifier transistor on digit is connected to $V_{cc}$ at its drain through a first pull up transistor and the p sense amplifier transistor on digit bar is connected to $V_{cc}$ at its drain through a second pull up transistor. A logic circuit generates control logic that actuates either both pull up transistors to initiate a typical read/write operation of a single memory cell or actuates one of the two pull up transistors to initiate a flash write to all of the memory cells on the selected wordline.

24 Claims, 8 Drawing Sheets

SIMPLIFIED LOW POWER FLASH WRITE OPERATION

FIELD OF THE INVENTION

This invention relates to the electrical design utilized in semiconductor manufacturing technology and, more specifically, to the apparatus and method for performing a substantially simultaneous and substantially identical write operation of a plurality of memory cells.

BACKGROUND OF THE INVENTION

The dynamic random access memory (DRAM) device 1 represented by the diagram of FIG. 1 stores digital data in an arrangement of memory cells 3. An arrangement of memory cells is called an array. The cells 3 are arranged in the array in a configuration of intersecting rows 5 and columns 6. The rows 5 are also referred to as wordlines 5. Each memory cell comprises a storage capacitor (not shown) capable of holding a charge and a metal-oxide semiconductor field effect transistor (MOSFET) (not shown) for accessing the capacitor charge; hereinafter this transistor is referred to as an access transistor. The charge is a voltage potential referred to as a data bit and is typified as either a high voltage or a low voltage. Therefore, the memory has two states; often thought of as the true logic state and the complementary logic state. The data bit is amplified and latched to the digit lines 7 by sense amplifier 8.

There are two options available in a DRAM memory; a bit of data may be stored in a specific cell in the write mode, or a bit of data may be retrieved from a specific cell in the read mode. The data is either transferred from the digit lines 7 to Input/Output lines, (I/O), 9 in the read mode; or transferred from the I/O lines 9 to the digit lines 7 in the write mode. In either case, the data is transferred through MOSFETs 10 used as switching devices and called decode transistors. For each bit of data stored, its true logic state is available at a first I/O line 11 and its complementary logic state is available at a second I/O line 13, designated I/O complement. For purposes of this discussion, I/O and I/O complement lines are often referred to as just I/O lines 9. Although each cell 3 is only connected to one digit line 7 through an activated access transistor, each cell 3 is electrically referenced to two digit lines 7, referred to as a digit line pair 15, through the sense amplifiers 8. The digit line pair 15 comprises the "digit line" 17 for coupling true data and the "digit bar line" 19 for coupling complementary data. Typically, the digit line 17 is referred to as digit and the digit bar line 19 is referred to as digit bar. The digit line pair 15 couples the true and complementary data between the selected cell 3 and the I/O lines 9.

In order to read from or write to a cell 3, the particular cell 3 in question must be selected or sometimes referred to as "addressed." A particular cell 3 is selected when the row decoder 21 activates a wordline 5 and the column decoder 23 activates a column 6. The electrical intersection of the activated wordline 5 and activated column 6 determines which cell 3 has been selected.

A supply potential $V_{cc}$ and a ground reference potential are available to the circuitry of the memory device. Between cycles of cell selection it is necessary to equilibrate the digit lines of each digit line pair 15 in a memory array to the same voltage, usually $V_{cc}/2$. This equilibration of the digit lines is often referred to as the precharge cycle. Equilibrate circuitry (not shown) parallel with the sense amplifier essentially shorts the digit lines together and holds them at $V_{cc}/2$. This equilibration is necessary so that the digit lines 7 are ready to receive data during the next cycle.

In order to facilitate an understanding of the present invention, pertinent aspects of a typical write operation to a single cell are explained below with reference to FIG. 2. FIG. 2 more fully depicts the circuitry relevant to two digit line pairs 15A and 15B of the digit line pairs 15 shown in FIG. 1. The numbers pertinent to components in FIG. 1 are relevant to similar components in FIG. 2.

Digits 17A and 17B are connected to memory cells 3A and 3B respectively and are accessed through row 5A. Digit bars 19A and 19B are connected to memory cells 3C and 3D respectively and are accessed through row 5B. Therefore, memory cells 3A and 3B store data in true form and memory cells 3C and 3D store data in complementary or inverse form. The p sense amplifiers 8A and 8B and the n sense amplifiers 8C and 8D latch data on the digit line pairs 15A and 15B respectively during read and write operations.

During standby switching transistors 24 comprising the pull up p-type MOSFETs (p switching transistors) 25 and the pull down n-type MOSFET (n switching transistor) 26 are off and the data remains stored in cells 3A through 3D. During a write or read operation all of the p 25 and n 26 transistors are actuated. The p switching transistors 25 are actuated by a low signal applied to their gates. Once actuated, the p switching transistors 25 couple the supply voltage $V_{cc}$ 27 to the circuit. The n switching transistor 26 is actuated by a high signal applied to its gate. Once actuated, the n switching transistor 26 couples the ground reference potential 28 to the circuit.

For example, assume cell 3A is selected for a write operation. An active output from the row decoder activates wordline 5A. The active wordline 5A actuates the cells' 3A and 3B access transistors 29A and 29B pertinent to wordline 5A, while access transistors 29C and 29D pertinent to inactive wordline 5B remain deactivated. The switching transistors 24 are actuated and digit 17A is latched to the true data stored in cell 3A While digit bar 19A is latched to the complement of the true data. Similarly, digit 17B is latched to the true data stored in cell 3B while digit bar 19B is latched to the complement of the true data. Next the column decoder activates column 6A which in turn actuates decode transistors 10A. Column 6B remains inactive since it was not activated by the column decoder. Consequently decode transistors 10B remain off. In a write mode the input data is coupled through the actuated decode transistors 10A from the I/O lines 9 to the digit line pair 15A where the input data overwrites the data previously latched to digit line pair 15A. The data on digit line pair 15B is not disturbed since decode transistors 10B are off.

Continuing with the example, since the digit lines 7 are sitting at approximately $V_{cc}/2$ in standby, the data coupled to the digit lines through the activated access transistors 29A and 29B effect a change in voltage on digits 17A and 17B. Taking a specific example, assume the true data stored in memory cell 3A is low. Then the voltage on digit 17A is pulled below $V_{cc}/2$. Digit bar 19A remains at $V_{cc}/2$ since it is not directly connected to cell 3A; this leaves digit bar 19A at a relatively higher voltage potential than digit 17A. When switching transistors 24 are actuated, the sources 35 of cross coupled p-type sense amplifier MOSFETs (p sense amplifier transistors) 36 of the p sense amplifiers 8A and 8B are at $V_{cc}$ 27, the sources 37 of cross coupled n-type sense amplifier MOSFETs (n sense amplifier transistors) 39 of the n sense amplifier 8C and 8D are at ground 28, and sense amplifiers 8A through 8D latch the data stored in the memory cells to the digit line pairs 15A and 15B. The relative high on digit bar 19A turns on the n sense amplifier transistor 39A on digit 17A, pulling it to ground 28. The low on the digit 17A turns on the p sense amplifier transistor 36A on digit bar 19A pulling digit bar 19A high. Similar action occurs on digit pair 15B where the final state of digit 17B depends on the original data stored in cell 3B and coupled onto digit 17B through access transistor 29B. Thus, the sense amplifiers ensure that digits 17A and 17B and digit bars 19A and 19B retain the correct voltage by pulling the low to ground 28 and by pulling the high to $V_{cc}$ 27. Assume the data on I/O 11 is high and I/O complement 13 is low. When column 6A activates decode transistors 10A, the low on I/O complement overwrites the high on 19A. The sense amplifiers 8A and 8C now latch opposite the previous state with a high on digit 17A charging the storage capacitor 41 to a voltage greater than $V_{cc}/2$ through the activated access transistor 29A.

Next, the access transistors 29A and 29B turn off, the capacitor 41 remains charged, the switching transistors 24 turn off, the column 6A is deactivated and the digit line pair 15 equilibrates to approximately $V_{cc}/2$.

If the cell is on the digit bar 19, it stores complementary data and, conversely, if the cell is on the digit 17, it stores true data. During a read mode the sense amps latch digit and digit bar to the true and complementary value of the originally stored data. The data is then coupled to the I/O lines through activated decode transistors 10A or 10B.

Video RAMs having one megabit and higher densities may include a flash write mode. Flash write is a one cycle set or clear of an entire row. Typically a set is a high logic state and a clear is a low logic state. In a flash write operation all of the cells pertinent to a selected wordline simultaneously receive substantially identical data.

An integrated circuit (I.C.) memory products, such as DRAM and Video RAM, the amount of available memory is often referred to as the density. Density describes the total amount of memory fabricated on the circuit (i.e., 1 meg, 4 meg, and so forth).

It is common to provide memory products which contain a large number of storage cells. Each storage cell is addressable by a unique row and column address. Therefore n row and m column addresses can access an array of n times m storage cells. Such a memory device would accept data for storage through an input often called the "D" input. Data read from the memory would be presented on an output called the "Q" output.

Memory vendors often provide more than one configuration of a certain density product to better suit the needs of the consumer.

In one popular variation the memory is split into 4, 8, 16 or more equal segments, and these segments are accessed in parallel. In this variation less row and column addresses are required since each sub array is only a portion of the total memory density, and since the sub arrays typically respond to the same row and column address. Such a configuration multiplies the "D" and "Q" pins required for transferring data into and out of the I.C. In order to keep the package small the input and output functions are commonly combined to share the same pin which is now called a "DQ" pin. Each "DQ" pin services one of the aforementioned sub arrays which is then often referred to as a "DQ plane."

This division of the total density into equal sided and commonly addressed DQ planes is very useful in certain systems which use IC memory. The various available configurations are often referred to as "by one", "by four", "by eight" and so forth. For example a 1 meg VRAM may be split into 4 DQ planes, DQs, and is referred to as a 256K by four memory.

This division of the total density into equal sided and commonly addressed DQ planes is very useful in certain systems which use IC memory. The various available configurations are often referred to as "by one", "by four", "by eight" and so forth. For example a 1 meg VRAM may be split into 4 DQ planes, DQs, and referred to as a 256K by four memory. In the flash write operation mode all 512 cells on the selected row in each array (DQ) are set or cleared. In a typical read/write operation of a single memory cell one cell in each DQ is read from or written to.

Flash write is typically accomplished by modifying the column decode circuitry to access all columns simultaneously and by storing the set or clear data appearing on the I/O lines in all of the cells of the selected wordline. Typically video RAM specifications include a color register for each DQ to allow individual set and reset of each DQ. The individual color registers necessitate repeating the flash write control logic for each DQ.

There are at least two disadvantages in modifying the column decode circuitry in order to perform flash write. The circuitry is cumbersome and power consumption is high. The video RAM column decode circuitry includes considerations for block write, split transfers, by-four/by-eight options and page mode. Further column decode modifications for flash write tend to make the column decode circuitry even more cumbersome. Since previous data has already been latched by the sense amps to the cells, the previous data in all of the cells must be overwritten during flash write in the same manner the data was originally written into the cell. Power consumption is high in order to overwrite all columns in a given row simultaneously.

SUMMARY OF THE INVENTION

In the preferred embodiment of the present invention flash write, a simultaneous and substantially identical write operation to a selected plurality of memory cells, is performed by splitting the pull up of the p sense amplifier transistors. The p sense amplifier transistor on digit is connected to $V_{cc}$ at its source through a first pull up transistor and the p sense amplifier transistor on digit bar is connected to $V_{cc}$ at its source through a second pull up transistor. A control circuit generates control logic that actuates either both pull up transistors to initiate a typical read/write operation of a single memory cell or actuates one of the two pull up transistors to initiate a flash write to all of the memory cells on the selected wordline. The control circuit has control circuit input signals capable of active and inactive states. The inactive and active states of each input signal are characterized as having different voltage potentials.

Advantages of the present invention are at least two fold; power requirements are minimized, and circuitry is simplified. The flash write method of the preferred embodiment eliminates the need to overwrite previous data. The power required is comparable to a normal refresh cycle and is much lower than the power required to overwrite latched data. The implementation of two pull up transistors and the necessary control circuitry in lieu of more cumbersome decode circuitry, simplifies the video RAM circuitry for a flash write cycle.

DETAILED DESCRIPTION OF THE PREFERRED EMBODIMENT

Figure 1:
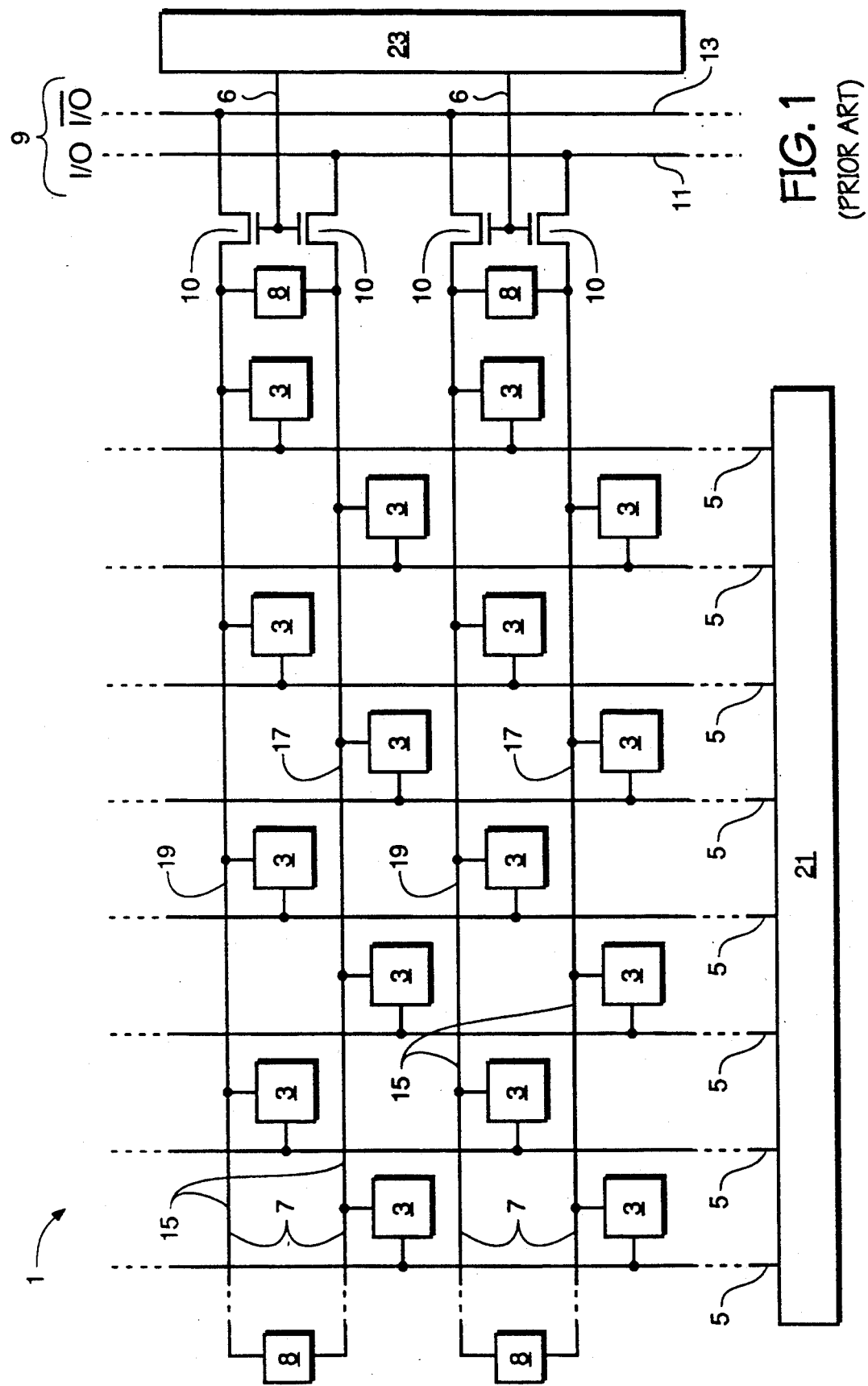
FIG. 1 is a block diagram of a typical DRAM memory array configuration of the prior art.
Figure 2:
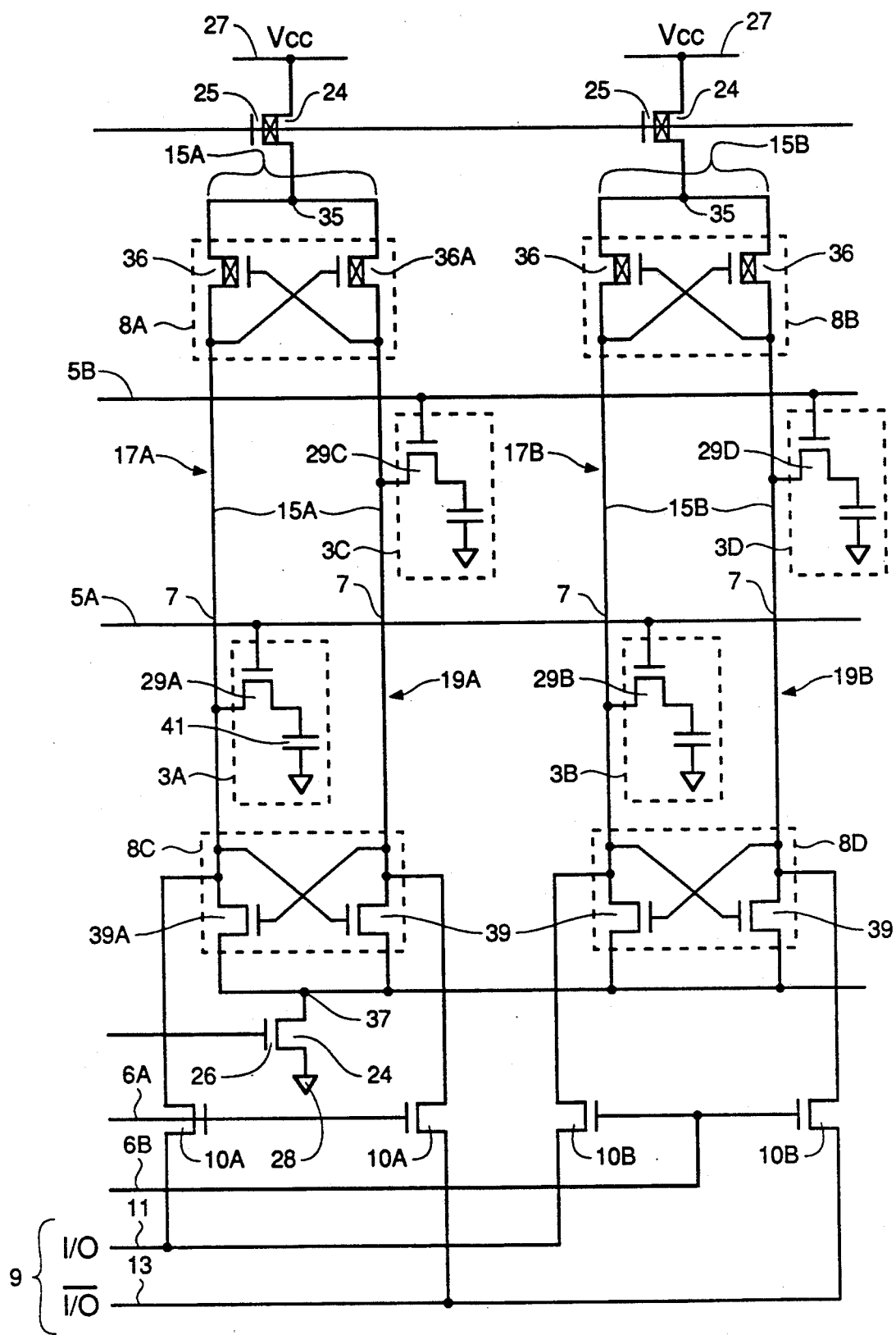
FIG. 2 is a more detailed schematic of a portion of the DRAM memory array configuration of FIG. 1.
Figure 3:
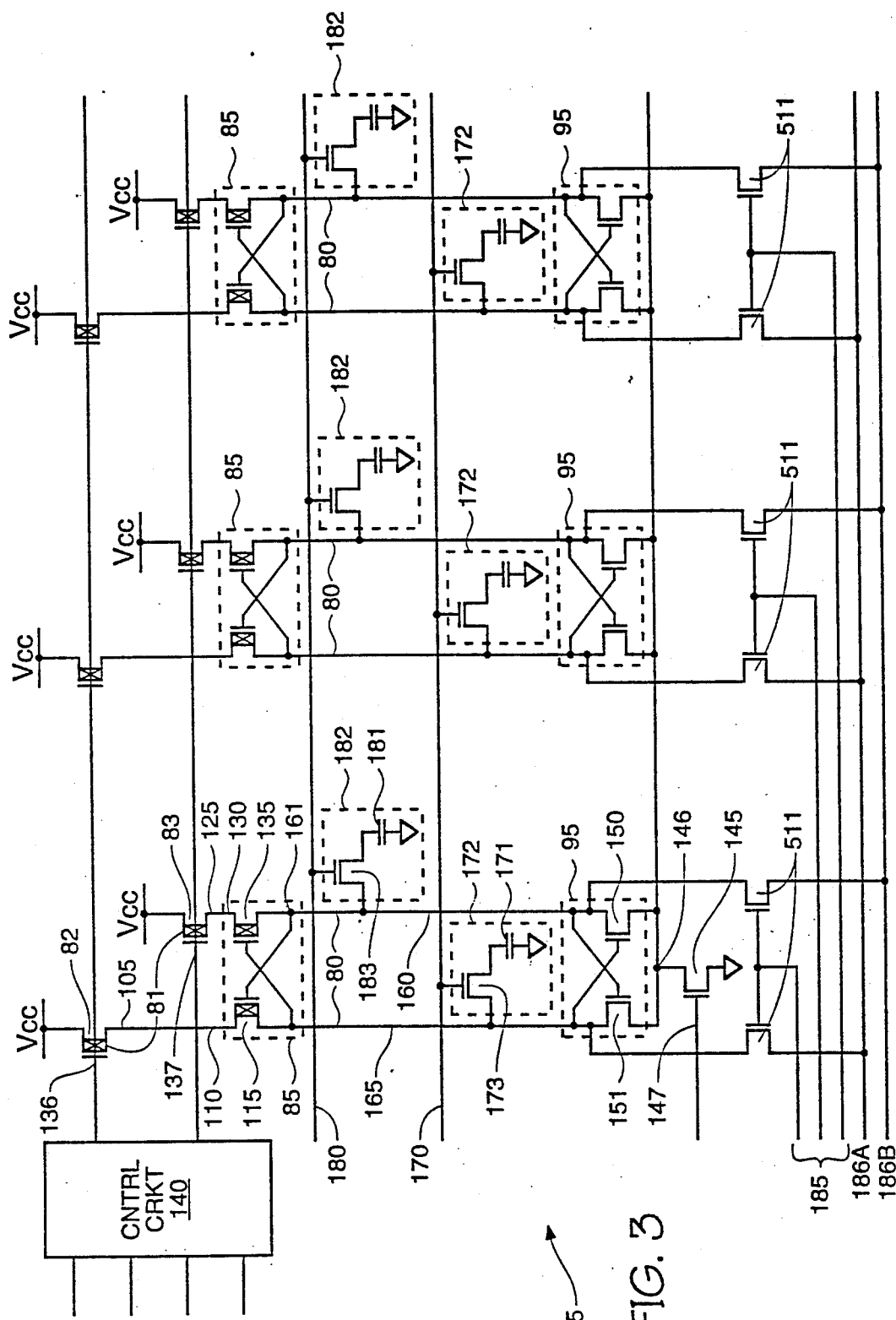
FIG. 3 is a detailed schematic of a portion of the DRAM memory array of the preferred embodiment comprising a control circuit shown in block diagram format.

The circuitry of the memory array 75 of the preferred embodiment of the invention is shown in FIG. 3. The circuitry either performs a flash write to all the cells on a selected row or performs a typical read/write operation of a single memory cell. In the present embodiment each digit line pair 80 has two pull up p switching transistors 1, comprising a digit switching transistor 82 and a digit bar switching transistor 83. Information is amplified and latched to the digit line pairs 80 by a p sense amplifier 5 and an n sense amplifier 95. In standby the digit line pairs 80 are equilibrated to $V_{cc}/2$. The digit switching transistors 82 are connected at their drains 105 to the sources 110 of the digit p sense amplifier transistors 115, and the digit bar switching transistors 83 are connected at their drains 125 to the sources 130 of the digit bar p sense amplifier transistors 135. A control circuit 140 provides control logic to the gates of the pull up p switching transistors 81 to initiate a flash write operation or a typical read/write operation of a single memory cell. Identical control logic is felt at the gates 136 of all of the digit switching transistors 82, and identical control logic is felt at the gates 137 of all of the digit bar switching transistors 83.

The drain of a pull down n switching transistor 145 is coupled to the sources of the digit bar n sense amplifier transistors 150 and the digit n sense amplifier transistors 151 at a common node 146. The pull down n switching transistor 145 is actuated by a switching input signal at its gate 147 prior to the actuating of both of the pull up p switching transistors 81 during a typical read/write operation of a single memory cell; and subsequent to the actuating of one of the pull up p switching transistors 81 during a flash write operation. The pull down n switching transistor 145 is a switching transistor taking the common node 146 to ground when actuated.

In the present embodiment when a typical read/write operation of a single memory cell is performed, the n sense amplifiers 95 and the p sense amplifiers 85 operate normally due to the fact that all pull up p switching transistors 81 and the pull down n switching transistor 145 are actuated, taking the sources at the common node 146 to ground through the pull down n switching transistor 145, and taking the sources of 110 and 130 of each digit p sense amplifier transistor 115 and each digit bar p sense amplifier transistor 135 respectively to $V_{cc}$ through the pull up p switching transistors 81. The operation then continues as was explained in the background. The control circuit 140 provides the gating signal to simultaneously actuate all pull up p switching transistors 81 in response to appropriate control circuit input signals.

A flash write operation is performed as follows, using the circuitry shown in FIG. 3. The memory array 75 is in a set condition for the selected wordline when the digit switching transistors 82 and the pull down n switching transistor 145 are actuated leaving the digit bar switching transistors 83 open. More specifically, the digit switching transistors 82 actuate followed by the pull down n switching transistor 145. The $V_{cc}/2$ voltages on digit bars 160 are seen as lows by digit p sense amplifier transistors 115 and activate the gates 161 of the digit p sense amplifier transistors 115. Digits 165 are coupled to $V_{cc}$ through actuated p sense amplifier transistors 115 and switching transistors 82. Thus the initial potentials on digits 165 are amplified since they are pulled toward the higher potential of $V_{cc}$. Consequently, when n switching transistor 145 is actuated, n sense amplifier transistors 150 are actuated, the digit bars 160 are coupled to ground through activated n sense amplifier transistors 150 and pull down n switching transistor 145. Thus the initial potentials on the digit bars 160 are amplified to the lower ground potential. Since the p and n sense amplifier transistors 115 and 150 are cross coupled between digits 165 and digit bars 160, the amplified high and low potentials are latched to digits 165 and digit bars 160, respectively. The digit n sense amplifier transistors 151 and the digit bar p sense amplifier transistors 135 are open. If the wordline 170 has been activated, a high is coupled from the digits 165 to the storage capacitors 171 of memory cells 172 through the activated access transistors 173. If the wordline 180 has been activated, a low is coupled from the digit bars 160 to the storage capacitors 181 of memory cells 182 through the activated access transistors 183. In both cases a high will be available on digits 165 during a read operation when the sense amplifiers latch the true and complementary data on the digit line pair 80.

Conversely, the memory array 75 is in a clear condition when the digit bar switching transistors 83 and the pull down n switching transistor 145 are actuated leaving the switching transistor 82 open. This results in a high stored in memory cells 182 if wordline 180 is selected and a low stored in memory cells 172 if wordline 170 is selected. In this case a low is available on digits 165 during a read operation.

The columns 185 and I/O lines 186A and 186B are reserved for a typical read/write operation of a single memory cell and not used in either the set or clear flash write operation of the preferred embodiment. Since no additional column decode circuitry is utilized in the preferred embodiment, the flash write circuitry is simplified. Additionally, the flash write method of the preferred embodiment eliminates the need to overwrite previous data. The power required is comparable to a normal refresh cycle and is much lower than the power required to overwrite latched data. In conclusion, the implementation of two pull up transistors and the necessary logic control circuitry of the present invention in lieu of the more cumbersome decode circuitry, simplifies the video RAM circuitry for a flash write cycle.

Figure 4:
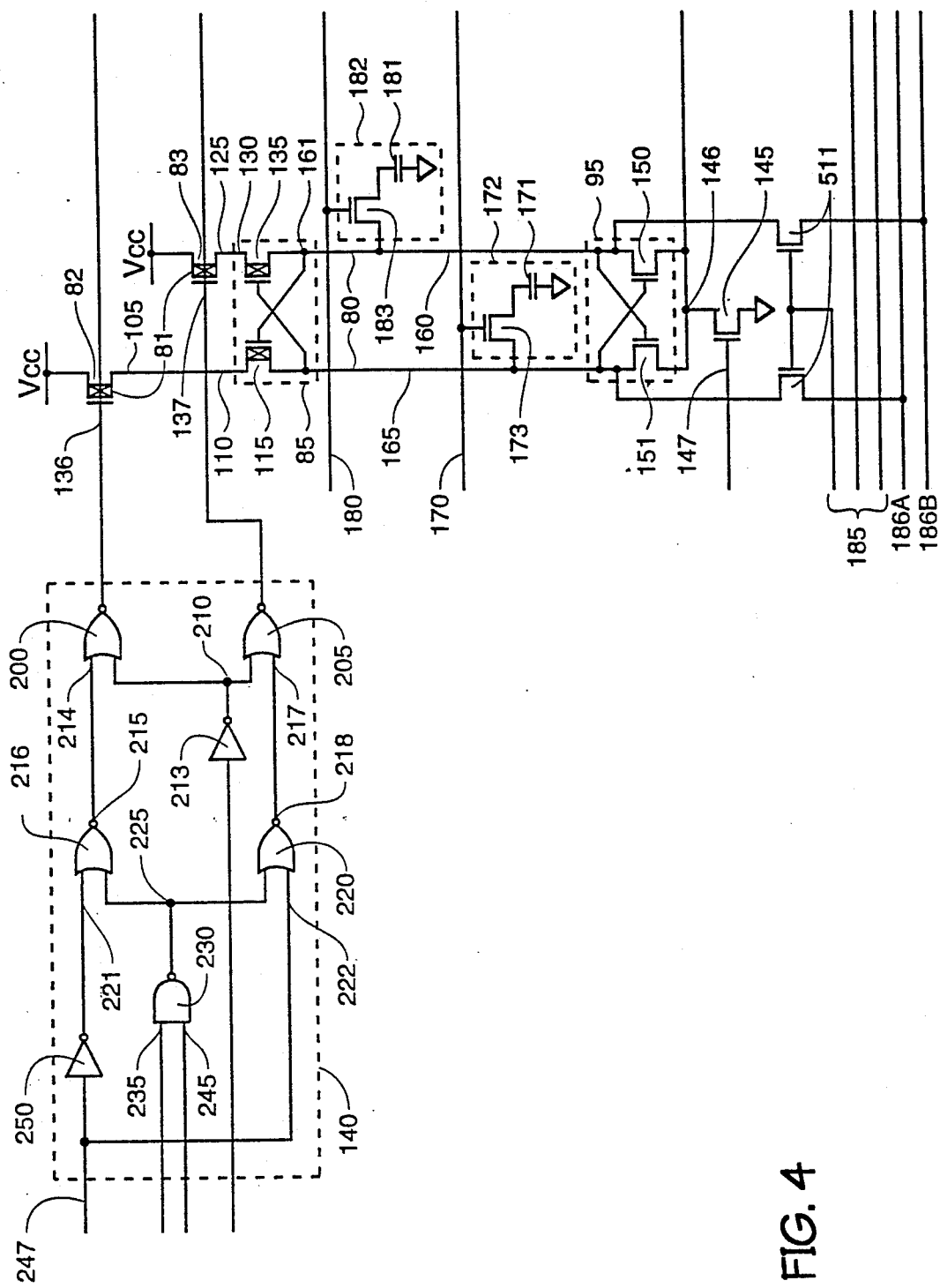
FIG. 4 is a detailed schematic of the control circuit and a portion of the DRAM memory array shown in FIG. 3.

Although the control logic of control circuit 140 may be implemented with various control circuitries, the following provides a description of the circuit configuration of the control circuit 140 of the preferred embodiment. The actual implementation is not critical to the concept. The control circuit 140 and corresponding control circuit input signals determine the control logic indicative of the type of operation to be performed, whether it be a flash write or a typical read/write operation of a single memory cell. FIG. 4 is the preferred embodiment of the control circuit 140 shown in block diagram format in FIG. 3. Numbers pertinent to components in FIG. 3 are utilized again to identify corresponding components depicted in FIG. 4. Two two input NOR gates 200 and 205 couple the control circuit 140 to pull up transistors 81. Digit switching transistors 82 are actuated by NOR gate 200 and digit bar switching transistors 83 are actuated by NOR gate 205. A low NOR gate output signal will turn on its respective transistor. The second inputs of NOR gates 200 and 205 are tied to a common node 210. A read/write firing signal is inverted by inverter 213 to provide a signal at the common node 210. A low read/write firing signal takes the second inputs of NOR gates 200 and 205 high to gate all pull up p switching transistors 81 during the normal read/write operation of a single memory cell. A low at the common node 210 enables the NOR gates 200 and 205 for a flash write. The first input 214 of NOR gate 200 is coupled to the output 215 from a two input NOR gate 216, and the first input 217 of NOR gate 205 is coupled to the output 218 of a two input NOR gate 220, NOR gates 216 and 220 having second inputs connected at common node 225. Signals at the first inputs 221 and 222 of NOR gates 216 and 220 respectively are the inverse of each other. The common node 225 is connected to the output from a two input NAND gate 230. The first input 235 of NAND gate 230 accepts a flash write enable signal; when high flash write is enabled and when low, a typical read/write operation of a single memory cell is enabled. The second input 245 is responsive to an advanced timing signal that initiates flash write when it is high and the flash write enable signal is high. Since the p sense amplifiers 85 are timing sensitive, an advance timing signal is imperative in order to actuate the p sense amplifier at a predetermined critical time. The advance timing signal will allow a high signal to be latched to the correct digit line in advance of the actuating of the n sense amplifiers 95. Thus the correct data will be written to the selected cells when the pull down n switching transistor 145 is actuated and the n sense amplifiers 95 are actuated. When the output signals of NOR gates 200 and 205 are complements they provide the set and clear signals for the flash write, a low output only at NOR gate 200 setting the device and a low output only at NOR gate 205 clearing the device. The output 247 from a one bit storage device sometimes called a color register (not shown) is inverted at an inverter 250 to the first input 221 of NOR gate 216 and is directly coupled to the first input 222 of NOR gate 220. A high from the one bit color register sets the selected memory and a low clears the selected memory.

In summary, the flash write cycle is initiated by the advance timing signal and actuates one side of the p sense amplifier prior to the actuating of the n sense amplifier by a switching input signal actuating the pull down n switching transistor 145. The digit lines pertinent to the pull up p switching transistors 81 that actuate early will be forced high and the other side will be pulled low when the n sense amplifiers actuate. The digits will be written to the same data as stored in the color register. Each digit line pair is wired the same so that correct data is written to the full row.

Figure 5:
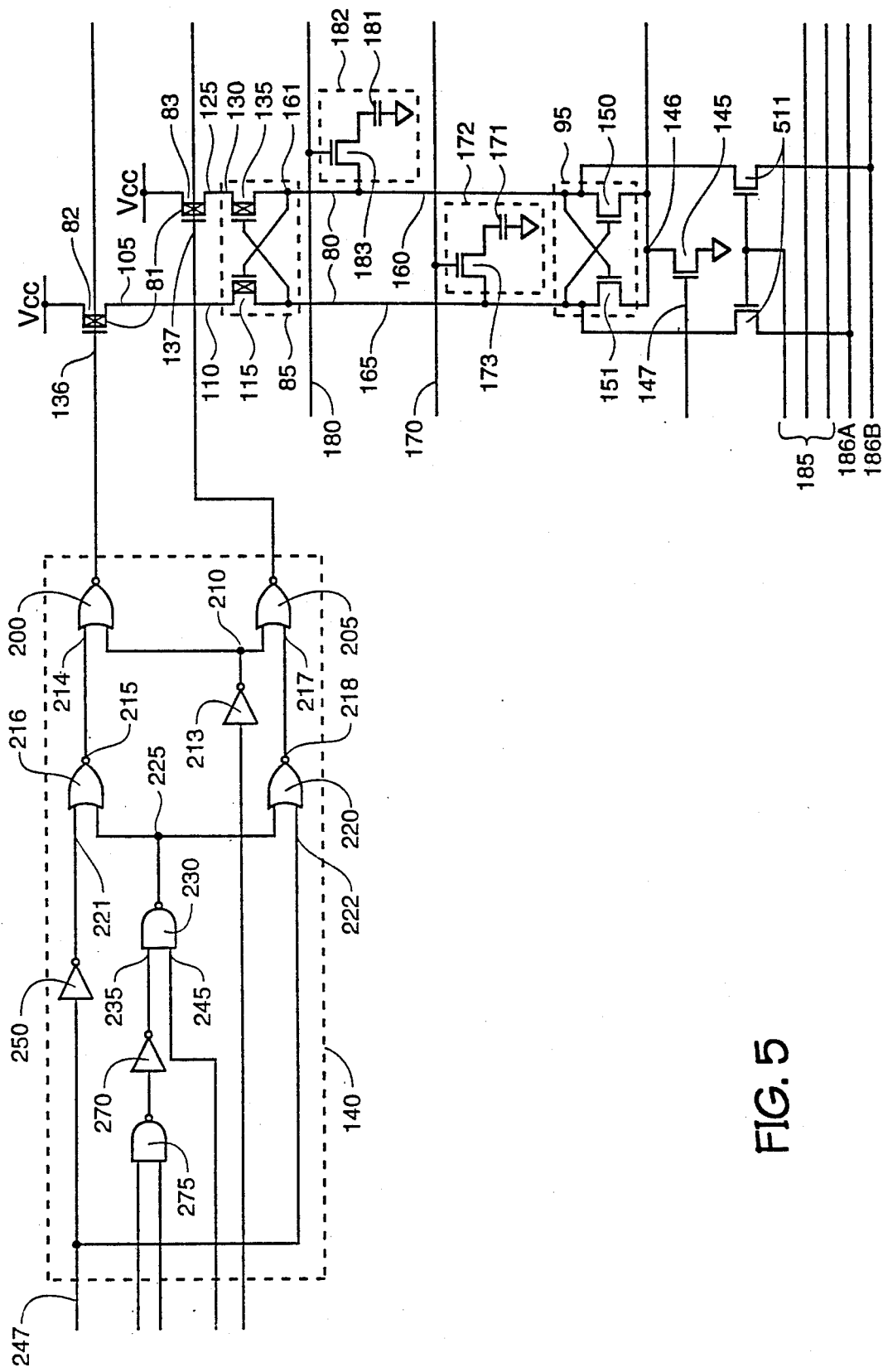
FIG. 5 is the control circuit and the portion of the DRAM memory array shown in FIG. 4 with the addition of a write inhibit function.

Since the typical flash write specification incorporates an independent color register for each DQ, an independent control circuit must be provided for each DQ. Inhibiting the function of the control circuits on an individual basis can be used to inhibit the flash write cycle to predetermined DQs. This implementation of the circuit of FIG. 4 is shown in FIG. 5. Numbers pertinent to components in FIG. 4 are utilized again to identify corresponding components depicted IN FIG. 5. An inverter 270 inverts an output signal from a two input NAND gate 275 to the input 235 of NAND gate 230. The two input signals of NAND gate 275 comprise the original flash write enable signal as well as a mask data input signal from an independent mask register. The mask data input signal provides the inhibit capability.

Figure 6:
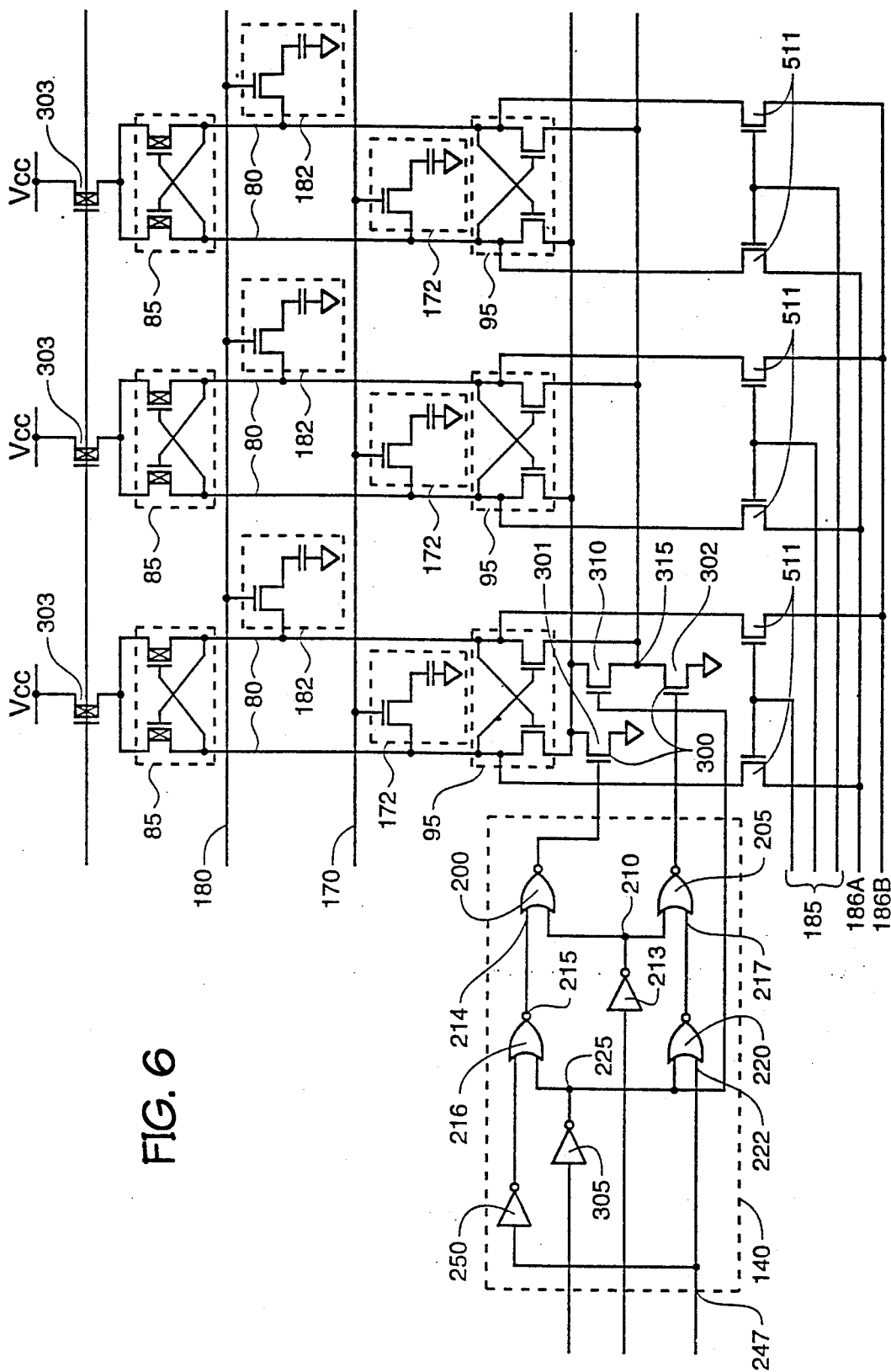
FIG. 6 is a detailed schematic of a control circuit and a portion of the DRAM memory array of an alternate embodiment of the invention.

An alternative to the preferred embodiment is depicted in FIG. 6. Numbers pertinent to components in FIG. 4 are utilized again to identify corresponding components depicted in FIG. 6. Since the alternative embodiment is similar to the preferred embodiment, the following discussion describes the differences between the two embodiments. In the case of the alternative embodiment the pull down n switching transistor 145 (FIG. 4) is replaced with two pull down n switching transistors 300 functionally similar to the two pull up p switching transistors 81 (FIG. 4). The two pull down n switching transistors 300 comprise a digit switching transistor 301 and a digit bar switching transistor 302. The two pull up p switching transistors 81 (FIG. 4) employed on each digit line pair 80 in the preferred embodiment are replaced with a single pull up p switching transistor 303 for each digit line pair 80. The single pull up p switching transistors 303 are functionally similar to the single pull down n switching transistor 145 (FIG. 4). The functional similarities refer to the selection and method of implementation of a flash write or a typical read/write operation of a single memory cell. Since the n sense amplifier is not timing sensitive, the advanced timing signal has been eliminated, and the flash write enable signal is inverted by inverter 305 to the second inputs 225 of NOR gates 216 and 220. However, the n sense amplifiers are voltage sensitive, therefore an additional balancing transistor 310 is incorporated in the design. The source of the balancing transistor 310 is coupled to the drain of the digit bar switching transistor 302 at node 315, and the drain of the balancing transistor 310 is connected at the drain of the switching transistor 301. The balancing transistor 310 is actuated by an output signal of inverter 305. The balancing transistor electrically balances the circuit in a typical read/write operation of a single memory cell when it is actuated shorting the drains of the pull down n switching transistors 300 together.

Figure 7:
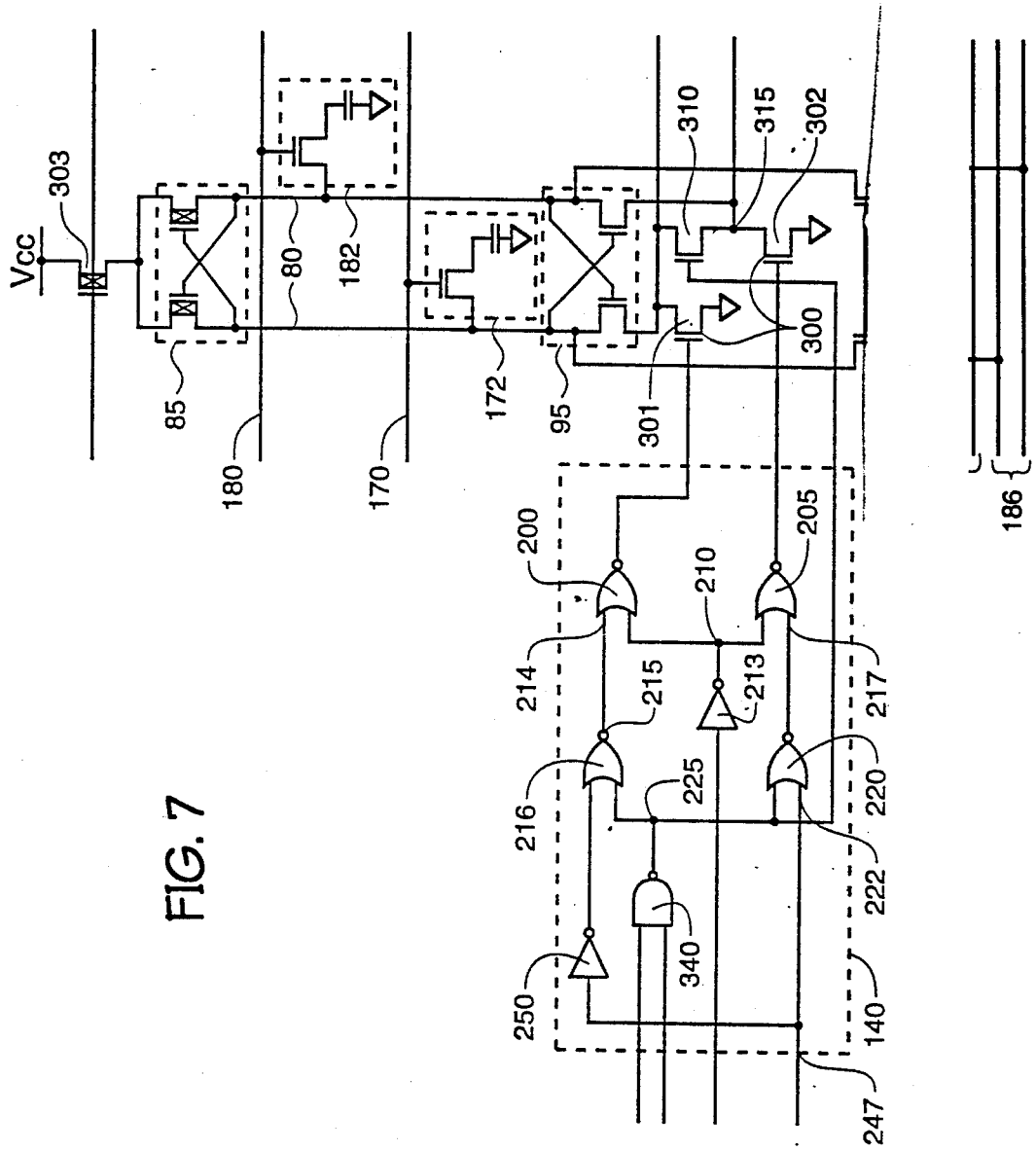
FIG. 7 is the control circuit and a portion of the memory array shown in FIG. 6 with the addition of a write inhibit function.

FIG. 7 shows the alternate embodiment with the addition of the flash write inhibit function for a predetermined DQ. Numbers pertinent to components depicted in FIG. 6 are utilized again to identify corresponding components depicted in FIG. 7. In order to incorporate a flash write inhibit function for a predetermined DQ the inverter 305 (FIG. 6) is replaced with an NAND gate 340 having two input signals comprising the original flash write enable signal and the mask data input signal from an independent mask register. The mask data input signal provides the inhibit capability.

Figure 8:
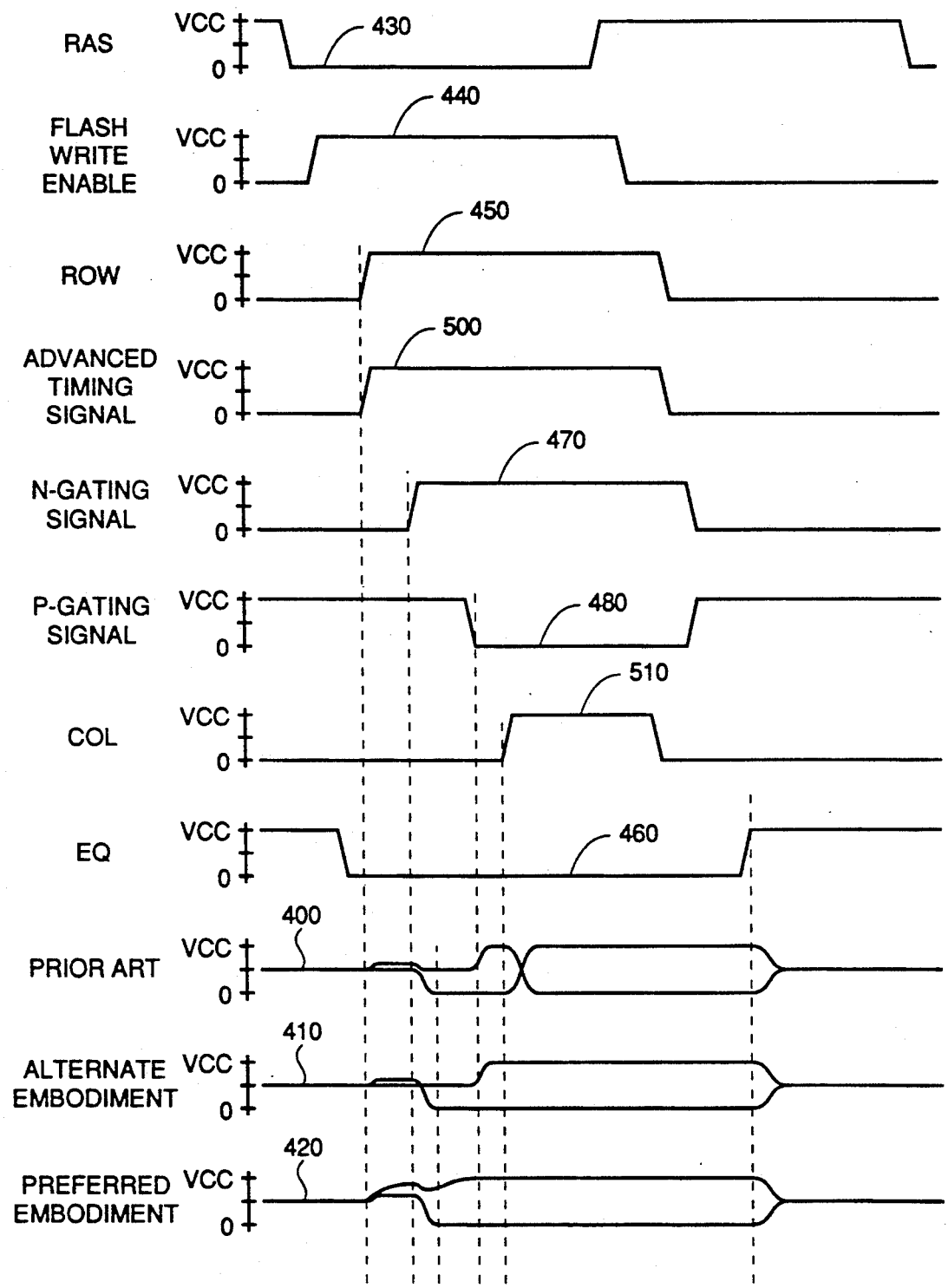
FIG. 8 is a timing diagram comparing the latching of flash write data to the digit lines of the prior art with the latching of flash write data to the digit lines of the preferred and alternate embodiments.

An analysis of FIG. 8 provides an understanding of the circuitry of the preferred and alternate embodiments with respect to the circuitry of the flash write of the prior art from the perspective of the timing of the data latched to the digit lines in reference to the timing of the control signals. FIG. 8 is pertinent to one complete flash write cycle, time horizontally expressed. Signals are voltages vertically expressed and are either thought of as high or low with respect one to the other unless otherwise specified, $V_{cc}$ being high and 0 volts being low. Representations 400, 410, and 420 are not restricted to $V_{cc}$ or 0 but rather depict the incremental voltage changes of the digit lines of the digit line pairs selected for flash write with respect to appropriate control signals 430, 440, 450, 460, 470, 480, 500, and 510.

Representation 400 depicts the voltages on the digit lines of digit line pairs of the prior art; representation 410 depicts the voltages on the digit lines of digit line pairs of the alternate embodiment; and representation 420 depicts the voltages on the digit lines of digit line pairs of the preferred embodiment.

Control signals 430, 450, 460, and 470 are relevant to all three representations 400, 410, and 420. In order to perform flash write, the row address strobe (RAS) signal 430 has to go low. RAS signal 430 is asserted low to access the address lines for row information, ROW signal 450. The equilibrate (EQ) signal 460 holding the digit lines at $V_{cc}/2$ must be disabled; in this case a low disables the equilibration of the digit lines. When the digit lines are no longer equilibrated the data stored in the memory cells affect the voltage on the digit lines when ROW is asserted high.

The flash write enable signal 440 is asserted high to enable flash write in representations 410 and 420. Flash write enable signal 440 is a control circuit input signal.

The n gating signal 470 functionally provides actuating and timing capabilities for n switching transistors. The n gating signal 470 is the switching input signal in representation 420 and is functionally equivalent to the switching input signal in representation 400. The n gating signal 470 is the read/write firing signal to the control circuit in representation 410. The p gating signal 480 provides actuating and timing capabilities for p switching transistors. The p gating signal 480 is the switching input signal in representation 410 and is functionally equivalent to the switching input signal in representation 400.

For representation 400 the n gating signal 470 in conjunction with the p gating signal 480 and the ROW signal 450 effect the latching of the digit lines to the voltage level of the data stored in the memory cells. The column decode (COL) signal 510 is only relevant in the prior art representation 400. COL signal 510 asserted high activates decode transistors 511, see FIGS. 3–7, which couple the data from the I/O lines to the digit lines. This necessitates overwriting the data latched to the digit lines when the ROW signal 450 was asserted high and incorporates a time delay when latching the data on the I/O lines to the digit lines at the active column signal 510.

In representation 400 of the prior art the charge transferred from the storage cell pulls the digit line latching a high slightly higher than $V_{cc}/2$ when the ROW signal 450 goes high. Next the n gating signal 470 goes high pulling the relatively higher digit line slightly lower and the relatively lower digit line to a low. Next the p gating signal 480 goes low pulling the digit line latching a high to a high. This data was stored in the memory cell and overwritten by the data on the I/O lines when the COL signal 510 goes high.

In representation 410 of the alternate embodiment the charge transferred to the digit line from the storage cell pulls the digit line slightly higher than $V_{cc}/2$ when the ROW signal 450 goes high. Next the n gating signal 470 goes high pulling only the digit line latching low to a low until the p gating signal 480 goes low pulling the digit latching high to a high. In this case the n gating signal is the read/write firing signal to the control circuit. The p gating signal is the switching input signal directly driving the gate of the p switching transistors. The circuitry of the alternate embodiment is less complex than the circuitry of the prior art. Power requirements and latch times (the time required to latch data to the digit lines) of the alternate embodiment are reduced over the circuit of the prior art since data does not have to be overwritten.

Advanced timing signal 500 in conjunction with n gating signal 470 and ROW signal 450 effects the latching of the digit lines to the correct levels for representation 420 of the preferred embodiment. The charge from the cell pulls one digit line slightly above $V_{cc}/2$ when row signal 450 goes high. The circuitry pulls the digit line latching a high substantially above $V_{cc}/2$ when the advanced timing signal 500 is asserted high. Next the n gating signal 470 goes high; and the digit line latching low is quickly pulled to a low voltage, and the digit line latching high initially dips low and then is quickly pulled to a high voltage. In this case, the n gating signal is the switching input signal and the p gating signal is the control circuit read/write firing signal. The p gating signal has no timing effect for flash write operation. However when the p gating signal goes low it will latch data to the digit lines of a digit line pair in a typical read/write operation of a single cell in the preferred embodiment.

By analyzing the timing diagram it can be seen that latch times are less for representation 420 pertaining to the preferred embodiment than latch times for representation 400 pertaining to the prior art or latch times for representation 410 pertaining to the alternate embodiment.

The timing diagram illustrates that the voltages of digit and digit bar shown in representations 420 and 410 of the preferred and alternate embodiments respectively separate in the direction specified by the color register regardless of the data initially stored in the cell. Thus, the data does not have to be overwritten and the voltages are latched to the respective digit lines more quickly, consuming less power. Additionally, the circuitry is less cumbersome than the flash write circuitry of the prior art.

Once the data is latched to the digit lines and stored in the memory cells of the entire row selected for flash write, the control signals return to their normal states, the EQ signal 460 going high equilibrates the digit lines to $V_{cc}/2$.

The invention uses various materials which are electrically either conductive, insulating or semiconducting, although the completed semiconductor circuit device itself is usually referred to as a "semiconductor." The invention refers to a method of controlling addressed devices, and is not restricted to implementations which involve memory devices or semiconductor devices.

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

Many different circuit implementations can be used for this invention and the actual implementation is not critical to the concept. Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A memory circuit comprising:
    a) a first node connectable to a first potential corresponding to a first logic state;
    b) a second node connectable to a second potential corresponding to said first logic state;
    c) a third node connectable to a third potential corresponding to a second logic state;
    d) a first input/output line (186A) for accepting electrical input data and for providing electrical output data;
    e) a first memory storage cell (171) for storing said electrical input data and said electrical output data;
    f) a first digit (165) line for transferring said electrical input data and said electrical output data between said first input/output line (186A) and said first memory storage cell (171), said first input/output line (186A) electrically coupled to said first digit line (165);
    g) a second input/output line (186B) for accepting a complement of said electrical input data and for providing a complement of said electrical output data;
    h) a second memory storage cell (181) for storing said complement of said electrical input data and said complement of said electrical output data;
    i) a second digit line (160) for transferring said electrical input data and said electrical output data between said second input/output line (186B) and said second memory storage cell (181), said second input/output line (186B) electrically coupled to said second digit line (160);
    j) a first switching device (82, 301) electrically interposed between said first node and said first digit line (165);
    k) a first switching device (82, 301) electrically interposed between said second node and said second digit line (160);
    l) a third switching device (145, 303) electrically interposed between said third node and said first digit line (165) and electrically interposed between said third node and said second digit line (160);
    m) a first sense circuit (85) electrically coupled between both said first (165) and said second (160) digit lines, said first sense circuit (85) capable of electrically isolating said first digit line (165) from said first switching device (82, 301) and capable of electrically isolating said second digit line (160) from said second switching device (83, 302), said first sense circuit capable of sensing and latching said first and second digit lines to potentials having said first and second logic states; and
    n) a second sense circuit (95) electrically coupled between both said first (165) and said second (160) digit lines, said second (95) sense circuit capable of electrically isolating said first digit line (165) and said second (160) digit line from said third switching device (145, 303), said second sense circuit (95) capable of sensing and latching said first (165) and second (160) digit lines to potentials having said first and second logic states.

2. The memory circuit as specified in claim 1, wherein a first signal actuates both said first (82, 301) and said second (83, 302) switching devices during a normal read/write operation of the memory circuit, and wherein a second signal actuates only one of said first (82, 301) and said second (83, 302) switching devices during a flash write operation of the memory circuit.

3. The memory circuit as specified in claim 2, further comprising a first decode transistor for isolating said first input/output line (186A) from said first digit line (165) and a second decode transistor for isolating said second input/output line (186B) from said second digit line (160) during said flash write operation and for coupling said first input/output line (186A) to said first digit line (165) and for coupling said second input/output line (186B) to said second digit line (160) during said read/write operation.

4. The memory circuit as specified in claim 2, further comprising a first access transistor (173) electrically interposed between said first memory storage cell (171) and said first digit line (165) and a second access transistor (183) electrically interposed between said second memory storage cell (181) and said second digit line (160), said first (173) and said second (183) access transistors actuated when said electrical input data is written to said first (171) and said second (181) memory storage cells during said flash write operation and during said normal read write operation.

5. The memory circuit as specified in claim 2, further comprising a control circuit (140) for generating said first and said second signals.

6. The memory circuit as specified in claim 5, wherein said control circuit (140) responds to a read/write firing signal having an inactive state for allowing said first (165) and second (160) digit lines to equilibrate.

7. The memory circuit as specified in claim 5, wherein said control circuit (140) responds to a data bit having a logic state to be written to said first digit line (165) or said second digit line (160) during said flash write operation.

8. The memory circuit as specified in claim 5, wherein said control circuit (140) responds to a flash/- write enable signal, an active state of said flash write enable signal enables said control circuit (140) to generate said second signal, and an inactive state of said flash write enable signal enables said control circuit to generate said first signal.

9. The memory circuit as specified in claim 5, wherein said control circuit (140) responds to a masking signal to inhibit said flash write operation.

10. The memory circuit as specified in claim 2, further comprising:
   a) a first plurality of said first digit lines (165); and
   b) a second plurality of said second digit lines (160) such that during said flash write operation said electrical input data is substantially simultaneously written to said memory storage cell electrically coupled to each of said first digit lines (165) of said first plurality or substantially simultaneously written to said memory storage cell electrically coupled to each of said second digit lines (160) of said second plurality.

11. The memory circuit as specified in claim 10, further comprising:
   a) a first switch plurality of said first switching devices (82, 301), wherein each said first digit line (165) of said first plurality of said first digit lines (165) is electrically coupled to one of said first switching devices (82, 301) of said first switch plurality; and
   b) a second switch plurality of said second switching devices (83, 302), wherein each said second digit line (160) of said second plurality of said second digit lines (160) is electrically coupled to one of said second switching devices (83, 302) of said second switch plurality.

12. The memory circuit as specified in claim 1, further comprising a fourth switching device (310) electrically interposed between an output of said first switching device (301) and an output of said second switching device (302), said fourth switching device (310) coupling an output of said first (301) and an output of said second (302) switching device to a common node in order to reduce voltage sensitivity affects of said first (302) and said second (302) switching devices.

13. The memory circuit as specified in claim 1, wherein said first and said second potentials are the same.

14. A method for writing to a memory cell, comprising the following steps:
   a) actuating a first switching device (82, 301) electrically coupled to a first plurality of digit lines (165) and electrically coupled to a first potential corresponding to a first logic state;
   b) deactuating a second switching device (83, 302) electrically coupled to a second plurality of digit lines (160) and electrically coupled to said first potential;
   c) actuating a third switching device (145, 303) electrically coupled to said first and said second pluralities and electrically coupled to a second potential corresponding to a second logic state;
   d) latching a potential having said first logic state to said first plurality;
   e) latching a potential having said second logic state to said second plurality;
   f) isolating said second plurality from said first potential; and
   g) writing electrical input data substantially simultaneously to at least one memory cell (171) electrically coupled to each said digit line (165) of said first plurality.

15. The method as specified in claim 14, further comprising writing complementary electrical input data substantially simultaneously to at least one memory cell (181) electrically coupled to each said digit line (160) of said second plurality.

16. A method for driving electrical data to a digit line, comprising the following steps:
   a) actuating a first transistor (145, 303) electrically coupled to a first potential and electrically coupled to a first (165) and a second (160) digit line, said first potential corresponding to a first logic state;
   b) in a flash write operation, deactuating a decode device in order to isolate a first (186A) and a second (186B) input/output line from said first (165) and said second (160) digit lines, respectively; and
   generating first control signals to actuate a second transistor (82, 301) electrically coupled to said first digit line (165) and deactuate a third transistor (83, 302) electrically coupled to a second digit line (160), said second (82, 301) and said third (83, 302) transistors electrically coupled to a second potential corresponding to a second logic state, said deactuated third transistor (83, 302) isolating said second digit line (160) from said second potential, and said actuated second transistor (82, 301) driving said first digit line (165) to potential having said first logic state; and
   c) in a read/write operation, actuating said decode device to provide electrical continuity between said first input/output line (186A) and said first digit line (165) and to provide electrical continuity between said second input/output line (186B) and said second digit line (160); and
   generating second control signals to actuate both said second (82, 301) and said third (83, 302) transistors, thereby driving a potential having one of said first and second logic states from said first input/output line (186A) to said first digit line (165) and from said second input/output line (186B) to said second digit line (160).

17. The method as specified in claim 16, further comprising substantially simultaneously driving a plurality of said first digit lines (165) to a potential of said first logic state in response to said step of generating said first control signals.

18. The method as specified in claim 17, further comprising actuating an access transistor (173) interposed between each of said first digit lines (165) and a memory storage cell (171) in order to write the electrical data having said first logic state to said memory storage cell (171).

19. The method as specified in claim 16, further comprising substantially simultaneously driving a plurality of said second digit lines (160) to a potential having said second logic state in response to said step of generating said first control signals.

20. The method as specified in claim 19, further comprising actuating an access transistor (183) electrically interposed between each of said second digit lines (160) and a memory storage cell (181) in order to write the electrical data having said second logic state to said memory storage cell (181).

21. The method as specified in claim 16, further comprising driving only one first digit line (165) of said plurality of first digit lines to one of said first or second logic states.

22. The method as specified in claim 21, further comprising actuating an access transistor (173) electrically interposed between each of said first digit lines (165) and a memory storage cell (171) in order to write the electrical data having said first or said second logic state to said memory storage cell (171).

23. The method as specified in claim 16, further comprising:
a) actuating a fourth transistor (310) during said step of generating said second control signal in order to couple an output of said second transistor (301) and an output of said third transistor (302) to a common node; and
b) deactuating said fourth transistor (310) during said step of generating said first control signals in order to isolate said outputs of said second (301) and said third transistors (302) one from the other.

24. The method as specified in claim 16, further comprising inhibiting said step of generating said first control signal.

* * * * *